(12) United States Patent
Chang et al.

(10) Patent No.: US 6,459,473 B1
(45) Date of Patent: Oct. 1, 2002

(54) DRIVE OF A WAFER STEPPER

(75) Inventors: Shuo Hung Chang; S. S. Li, both of Taipei (TW)

(73) Assignee: National Science Council, Taipei ( * ) Notice: Subject to any disclaimer, the term of this patent is extended or adjusted under 35 U.S.C. 154(b) by 0 days.

(21) Appl. No.: 09/626,918

(22) Filed: Jul. 27, 2000

(51) Int. Cl.[7] .................. G03B 27/58; G03B 27/62; G03B 27/42
(52) U.S. Cl. ............... 355/72; 355/53; 355/75
(58) Field of Search ............ 355/53, 55, 72–76; 310/10, 12; 356/399–401; 378/34, 35

(56) References Cited

U.S. PATENT DOCUMENTS

| | | | |
|---|---|---|---|
| 5,008,705 A | | 4/1991 | Sindledecker ............ 355/43 |
| 5,117,255 A | * | 5/1992 | Shiraishi et al. ............ 355/53 |
| 5,182,615 A | * | 1/1993 | Kurosawa et al. .......... 356/400 |
| 5,783,340 A | | 7/1998 | Farino et al. ............ 430/22 |
| 5,864,389 A | * | 1/1999 | Osanai et al. ............ 355/53 |

FOREIGN PATENT DOCUMENTS

| | | |
|---|---|---|
| TW | 319385 | 12/1985 |
| TW | 334888 | 12/1985 |

* cited by examiner

Primary Examiner—Russell Adams
Assistant Examiner—Henry Hung Nguyen
(74) Attorney, Agent, or Firm—Jacobson Holman, PLLC

(57) ABSTRACT

A piezoelectric-driven 2-D stage (X-Y axis) utilizing the frictional stick-slip effect and inertia force can be designed and fabricated to achieve ultra high resolution and long travel range. Based upon the principle of elastic deformation, a high resolution piezoelectric-driven micropositioner (Z-axis) is designed and fabricated. Moreover, a CD pick-up head and analog linear controller are integrated with Z-axis micropositioner to be a autofocus system. This design is based upon the requirement of the optical lithography developments by using 193 nm Excimer Laser. During this special lighography process, Z-axis micropositioner is needed for the laser beam focusing. A 2-D X-Y stepper is also needed for the movement of the wafer under laser exposure. The wafer stepper is based on the step-repeat and step-scan process.

12 Claims, 14 Drawing Sheets

DRIVE OF A WAFER STEPPER

BACKGROUND OF THE INVENTION

1. Field of The Invention

This invention is directed to a 2-D (X-Y axis) translation stage, which has a long travel range and high resolution. Moreover, a CD pick-up head, which is a low cost optical probe, is integrated with a Z-axis piezoelectric stage and an analog linear controller to be an optical autofocus system.

2. The Prior Art

Along with unremittingly progress of the precision engineering, in spite of the semiconductor industry, precision machinery industry, biological cell realm, optoelectronic system, microscopic organism, surface engineering, STM, SPM etc all make headway for microminaturization and precision. The needs of a micro or sub-micro position system are growing in number day by day, now there are already many precision position instruments in the industry field.

High-resolution position apparatus, constituting the drive of wafer stepper, is the most important item. However, there are already many precision position instruments or equipment in the industry at the present time. The instruments are limited by their resolution, therefore the total displacement is usually very small, and maximum travel range roughly reach only 200–300 $\mu$m. An example of manufactures of the wafer in semiconductor industry, apparent from the diameter of eight of inches wafer roughly is 200 mm, however processing technology of 12 inches of wafer, even more than a larger size wafer, have already become the main point. With these instruments, precision is enough, but characteristic of a position for total travel range is insufficient. This incapability will not satisfy the needs of future the semiconductor and precision engineering industries.

For development of the optical lithography using 193 nm Excimer Laser, a single degree of freedom (Z-axis) and a high precision piezoelectric stage, with a double degree of freedom (X-Y axis) stepper must be designed and fabricated. The single degree of freedom driver is used for focusing the application of the Excimer Laser, and the main function of an optical autofocus system is to make the operating plane of the Z-axis piezoelectric stage, which is always maintained, in the focus-operating scope of the Excimer Laser. A double degree of freedom stepper is used as an application of the etching wafer by the methods of Step- Repeat- Projection and Step- Scan- Projection.

Making use of the optical-focusing system is very extensive, all without exception a CD-ROM, DVD, optical measurement probe, surface measurement instrument etc., are all important application of them. U.S. Pat. No. 5,008, 705 disclosed an autofocus system which is applied to microlithography, assembly of lens, beamsplitter, and reflector. The system is used to automatically focus on a wafer, but its optical principle is not for the astigmatic method. U.S. Pat. No. 5,783,340 discloses a semiconductor wafer etching technique, which has equal depth fillister in the wafer that is used as the reference plane of the automatic focusing, detect movement, position and tilts of the wafer surface. ROC Patent No. 334888 describes an ultra high resolution 3-D micropositioner, which makes use of a piezoelectric-driven stage, that combined with mechanism of flexible contact, attempts to achieve the need of three-axes precise position, because using principle of flexible deformation, the position system can't achieve the long travel range. The 3-D non-contact measurement instrument includes the XY slide and the extend arm, which is connected with a projector and has an electromagnetic-driven motor. The motor is controlled by a computer slew to the appropriate angle. A problem is that the capability of the position resolution of the motor is worse than the piezoelectric material, which can generate cumulating error at over-slewing angle.

Methods of using a stepper in the market make use of the DC motor, stepping motor and ball bearing of leading screw type that they put in use of the electromagnetic principle. The creator of the wafer stepper can satisfy the semiconductor various needs of the industry, and with meticulous care, to research and create a modem wafer stepper after which is used in the application of the deep ultraviolet lithography etching wafer.

SUMMARY OF THE INVENTION

An object of the invention is to provide a novel wafer stepper which can cooperate with the needs of 193 nm DUV Lithography.

Another object of this invention is to provide the piezoelectric stage, which is single degree of freedom(Z-axis) and high translation resolution.

A further object of the invention is to use a CD pick-up head that is a low cost optical probe integrated with Z-axis piezoelectric stage and analog linear controller, to be an optical autofocus system.

An object of the invention is to provide a 2-D(X-Y) translation stage, which is in the long travel range and with high resolution.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 4(*b*) illustrates a diagram of a one way movement of the frictional-driven stage;

FIG. 4(*c*) illustrates a diagram of a fixed frictional-driven stage as set forth in the present invention;

FIG. 5(*b*) illustrates a relationship between an input voltage signal as an impulse waveform and the output movement;

REFERENCE NUMBER FOR THE ATTACHED DRAWINGS

Figure 1:
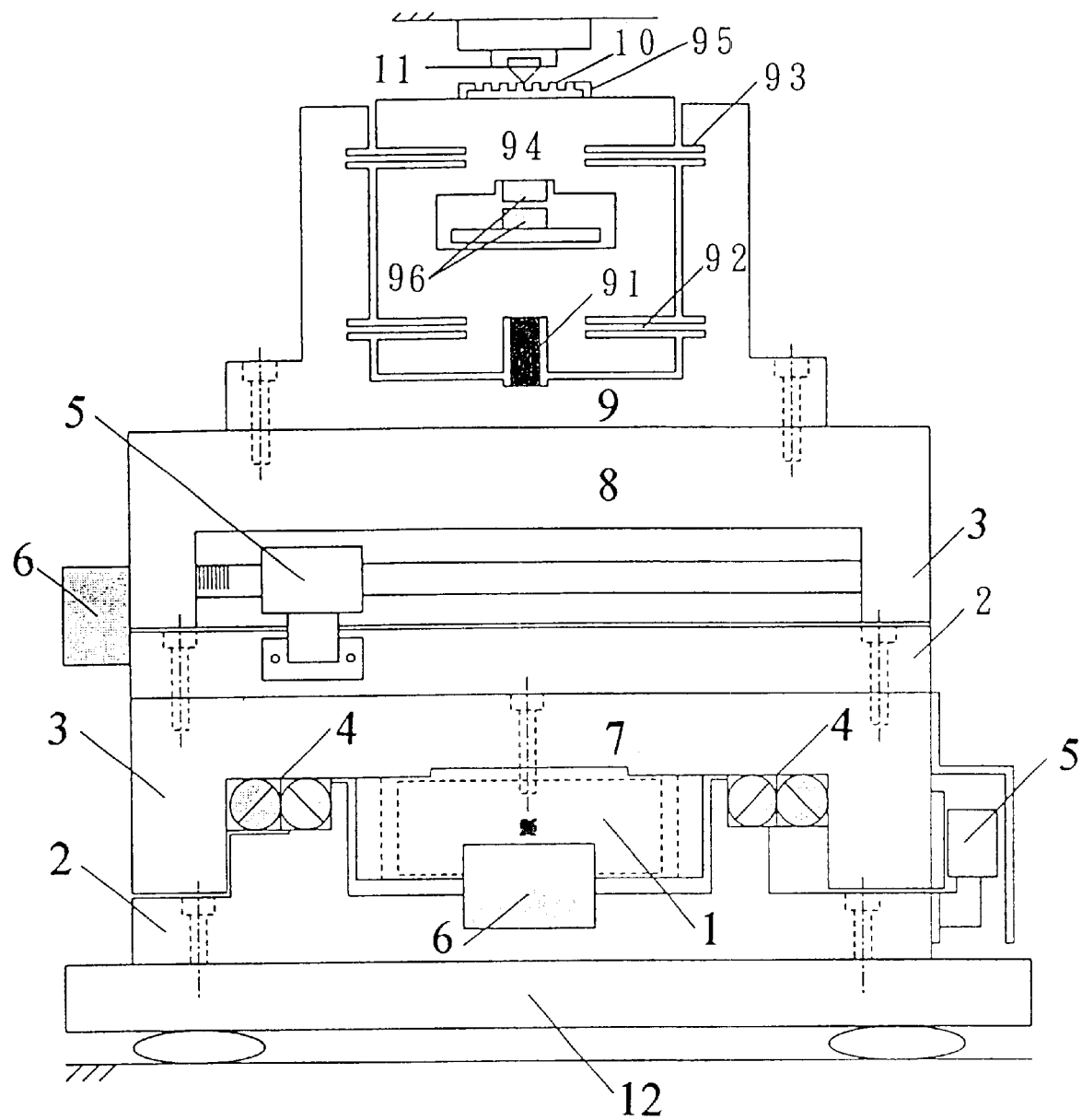
FIG. 1 illustrates a wafer stepper as set forth in the present invention.

1. driving mechanism
1001. mass block
1002. piezoelectric driver
1003. flat-blade string
1004. penetrable fillister
2. fixed base
3. translation stage
31. frictional interface
4. guidance apparatus
41. cross-roller beating slide
5. measurement system
51. linear optical encoder
6. frictional mechanism
61. prestress screw
62. stainless steel plate
63. clip block
64. glass fiber ferrule
65. frictional base
7. X-axis frictional-driven stage
8. Y-axis frictional-driven stage
81. power amplifier
82. analog/digital adapter (AD/DA)
84. focus error signal processing circuit
9. Z-axis piezoelectric stage
91. piezoelectric driver
92. flat-blade string
93. penetrable fillister
94. translation stage
95. sample holder
96. capacitive translation sensor
10. sample
11. CD pick-up head
111. laser diode
112. beamsplitter
113. collimating lens
114. astigmatic lens
115. quad detector
116. microscope objective
12. optical table

DESCRIPTION OF THE INVENTION

In describing preferred embodiment of the present invention illustrated in the drawings, specific terminology is employed for the sake of clarity. However, the invention is not intended to be limited to the specific terminology so selected, and it is to be understood that each specific element includes all technical and functional equivalents which operate in a similar manner to accomplish a similar purpose. It is also important to note that like parts are referenced by the same reference numeral throughout.

Piezoelectric ceramic of an accumulating layer is used as a translation driver with general reference to FIG. 1. A 2-D (X-Y axis) translation stage utilizing the frictional stick-slip effect and inertia force can be designed and fabricated to achieve ultra high resolution and long travel range. Additionally, basing upon the principle of elastic deformation, a high resolution piezoelectric-driven micropositioner (Z-axis) is designed and fabricated. Moreover, a CD pick-up head, which is a low cost optical probe, is integrated with Z-axis piezoelectric stage and analog linear controller to be an optical autofocus system.

The wafer stepper of the present invention is divided into three subsystems. There are X, Y-axis frictional driven stage (7, 8), Z-axis piezoelectric stage (9) and an optical autofocus system.

The X, Y-axis frictional-driven stage (7, 8) is placed in the bottom of the wafer stepper. Its driver is driven by a voltage waveform to promote the stage and be engaged in independent movement of X-axis and Y-axis.

The Z-axis driven stage (9) is fixed on the top of the X-Y axis frictional-driven stage (7, 8). Its driver is driven by a voltage waveform to promote the stage and be engaged in independent movement of the Z-axis, which is a perpendicular to the plane of the X and Y axis. Because it is placed on the top of the X-Y axis frictional-driven stage, it can complete a 3-D independent movement of the X, Y, and Z axis.

The light source and photo-detector of the optical autofocus system, which is placed above the Z-axis stage, can project light on the wafer, and can detect, reflective light on the wafer to be used as a beam focus signal processing unit.

The Z-axis driven stage (9) is fixed on the top of the X-Y axis frictional driven stage (7, 8), and optical autofocus system. It is placed on another base which is higher than the wafer, and can project an optical beam on the wafer surface. It also can provide reflective light on the wafer, which projects the light into photo detector inside the optical autofocus system. It can be utilized with the focus error signal processing circuit (84) and the analog linear controller, which can make control of the signal and a closed-feedback to promote an adjustment of the Z-axis stage (9). It will promote the wafer on the Z-axis stage and the movement in the Z~axis direction, to achieve the optical beam focusing on the wafer.

Each Subsystem

1. X-Y Axis Frictional Driven Stage

Figure 2:
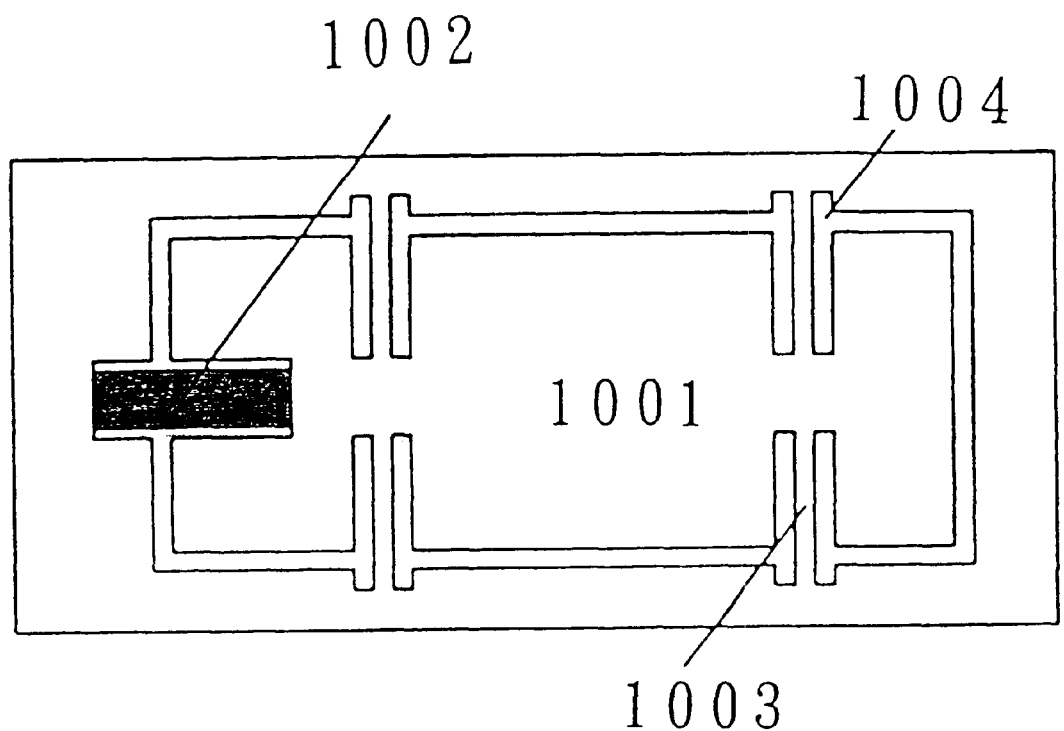
FIG. 2 illustrates a driving mechanism for use in the present invention.
Figure 3:
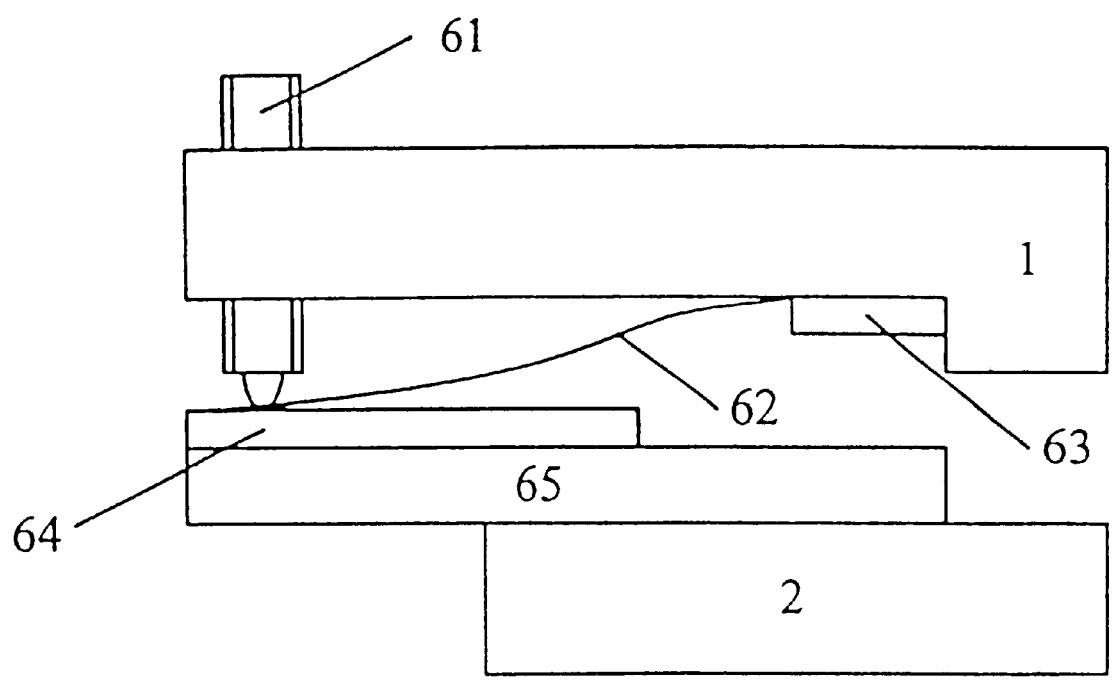
FIG. 3 illustrates a frictional mechanism with components as set forth in the present invention.

With reference to FIG. 1 the construction of the X axis frictional stage (7) and Y axis frictional stage (8) which are alike, can be divided into five divisions, that is driven mechanism (1), frictional mechanism (6), guiding or guidance apparatus (4), measurement system (5) and a control system for each one. Please refer to FIG. 2, driven mechanism (1) includes mass block (1001), piezoelectric driver (1002), flat-blade spring (1003) and penetration fillister (1004). Please refer to FIG. 3, frictional mechanism (6) includes a prestress screw (61), stainless steel plate (62), clip block (63), Glass Fiber Ferrule (64) and frictional base (65). Guidance apparatus (4) is a cross-roller bearing slide (41) which is a higher-straight line degree and a low friction coefficient. Ultra high resolution linear optical encoder (51) and electronic partition controller both are used in measurement system (5), and laser interferometer and high precision capacity micrometer are used as measurement identification of linear optical encoder. Control system includes personal a computer, analog/digital adapter (AD/DA, 82) and the power amplifier (81) of piezoelectric driver (1002). The input voltage waveform is composed by the C language, to feedback a coordinate value through linear optical encoder (51), then software is used to control the translation resolution and position precision of the X-axis frictional stage (7) and the Y-axis frictional stage (8).

Figure 5A:
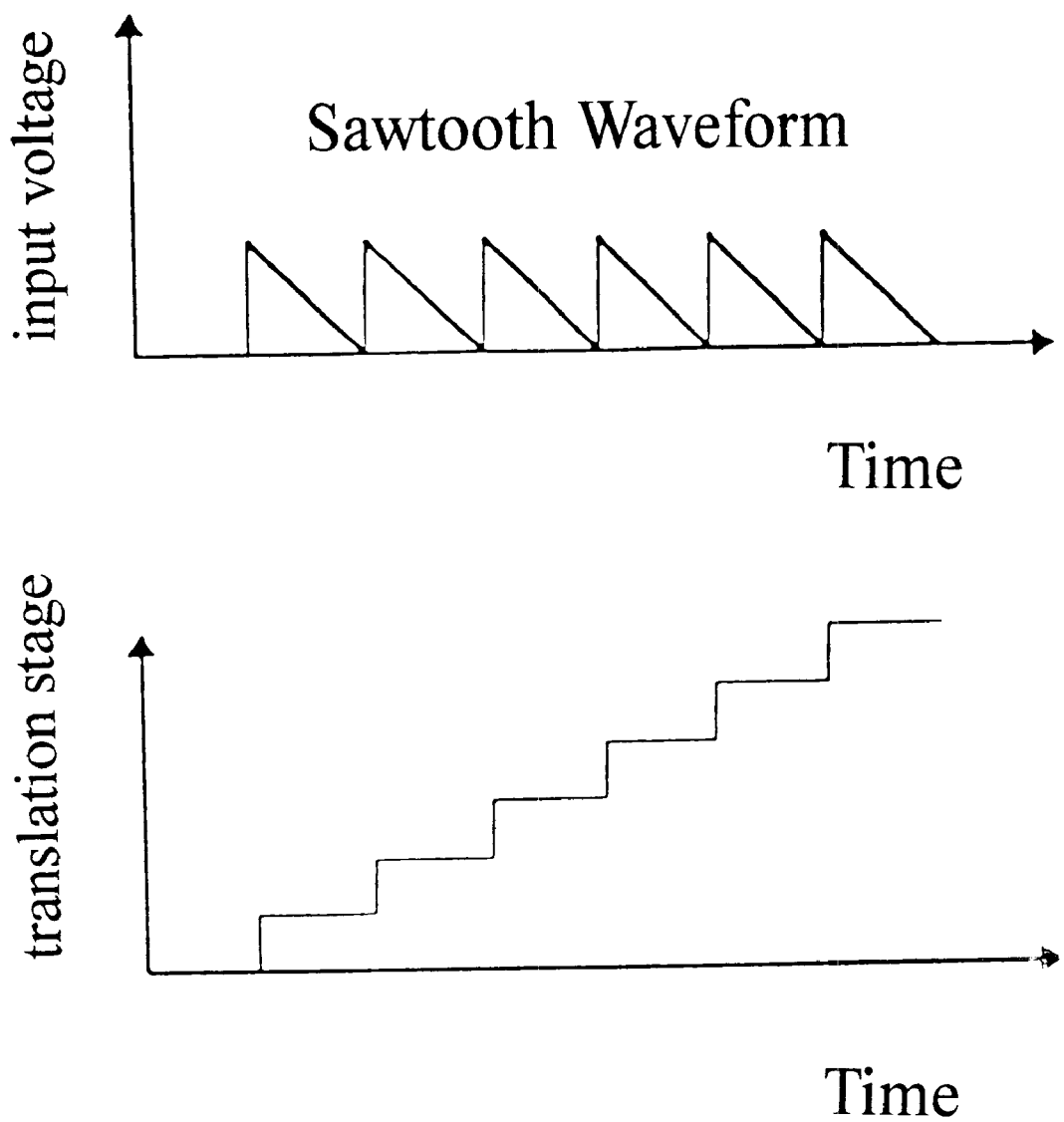
FIG. 5(*a*) illustrates a relationship between an input voltage signal as a sawtooth waveform and the output movement.
Figure 5B:
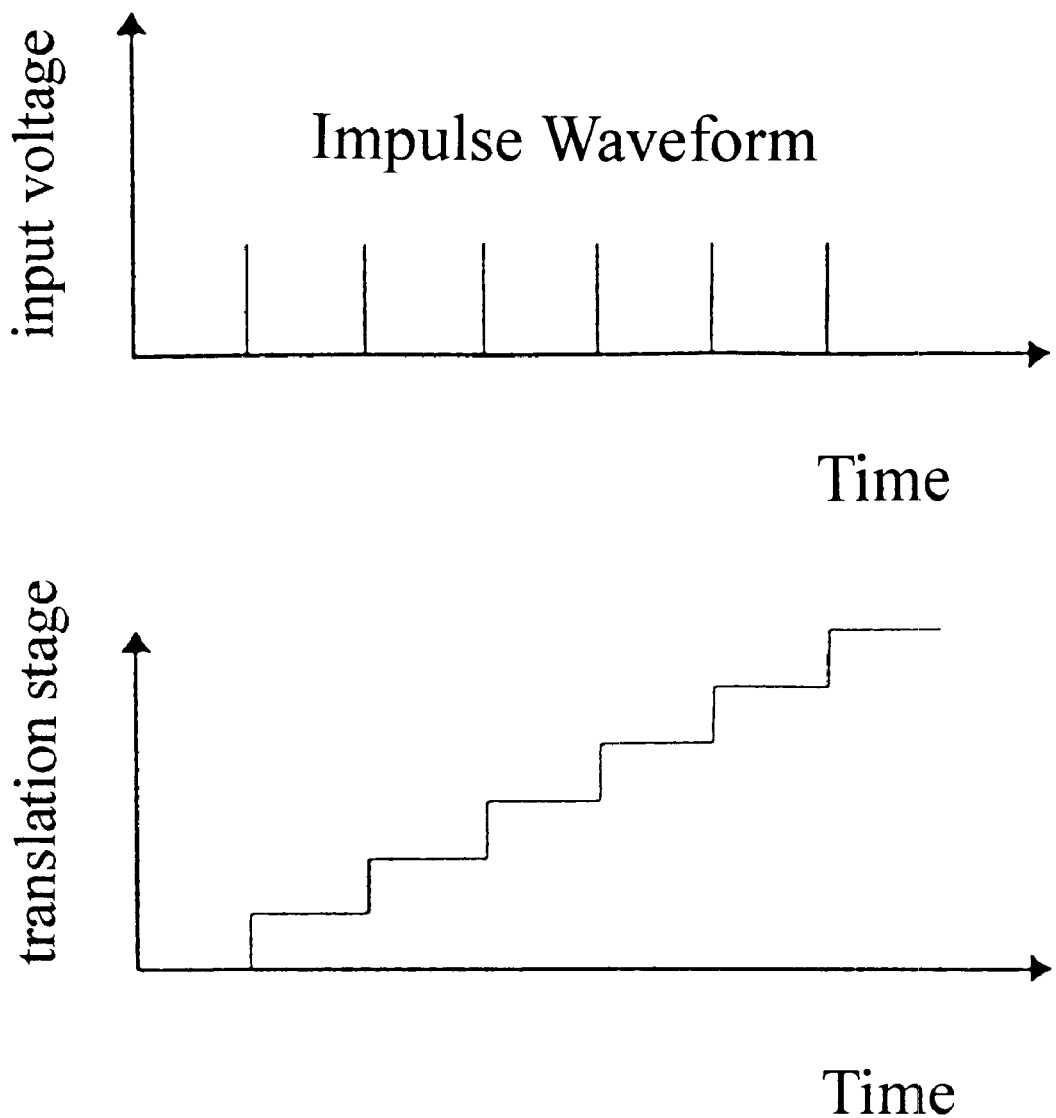

One end of the driver connects with the translation stage (3) the other end of driver connects with mass block (1001). One end of flat-blade string (1003) connects with translation stage (3), the other end of flat-blade string (1003) connect with mass block (1001). The translation stage (3) connects with cross-roller bearing slide (41), linear optical encoder (51) is placed in the translation stage (3) and the fixed base (2) translation stage (3) connects with friction mechanism (6), friction mechanism (6) connects with the fixed base (2). There is a differential discontinuous point (singular point) in the driving source of the driver (1), it makes the driver (1) move fast, so the mass block (1001) and translation stage (3) all bear equal inertia force. When this inertia force is larger than the maximum static frictional force inside frictional interface, there are situations of the sliding friction to take place between the translation stage (3) and fixed base (2), this cross-roller bearing slide (41) guided by the cross-roller bearing slide base, becomes straight line displacement, when the driving source makes the driver (1) move to the original length slowly, then the inertia force that translation stage (3) bears does not exceed the maximum static frictional force of the frictional mechanism (6), translation stage on stationary base through the friction force that frictional mechanism (6) provides the rest. This translation procedure can achieve the single step translation of the stage, if this translation procedure continuously progresses. It can immediately attain the function of the continuous translation because the stage that the frictional driving principle is in its travel range and does not limit it. Also, it is integrated with a linear optical encoder which presents a long travel range and high precision. It can detect its movement path at any time and its main function is to achieve a goal of the straight line stepping movement as shown in FIG. 5(*a*) which is a long travel range and high translation resolution. It can be used as an application of an optical etching wafer.

Piezoelectric driver (1002) is mainly used as the power source of the X-axis frictional stage (7) and Y-axis frictional stage (8). The adoptive piezoelectric driver (1002) is a piezoelectric ceramic of accumulating layer, it has the advantage of being compact in size, will respond quickly, heat is minimum, and control is easily accomplished in many ways. The piezoelectric driver (1002) is influenced by the effect of hysteresis. It does not show a completely linear performance, and it usually can make the piezoelectric driver have very good precision through feedback control, in addition with the resolution high, thrust is big. Piezoelectric driver (1002) can follow a different electrical waveform to achieve different performance of the motion. It can make the translation stage (3) generate a continuous stepping translation by the Stick- Slip Effect of the friction force. An ultra high resolution linear optical encoder (5) is placed on the stage and is used as a translation sensor to make use of the program control method of the computer. It is capable to proceed with the feedback positioning control of the X- Y axes, for providing the ability of the high translation resolution and long travel range positioning.

Through the flexible characteristics of the piezoelectric driver (1002),which follow the periodic voltage signal, it can be used as the power source of the translation stage (3). It can change the moving condition of piezoelectric driver along with difference of the additional voltage waveform, to affect the frictional quality of the stainless steel plate (62) and fiber-optic sleeve of frictional mechanism (6). By the action of the frictional stick-slip effect, it can make the X, Y axis frictional-driven stage (7, 8) be the different translation express. By using a different waveform, amplitude, or frequency of the voltage input, and if driving voltage is periodically waveform input, then the translation stage (3) can be continuously in the microstepping translation.

Figure 4:
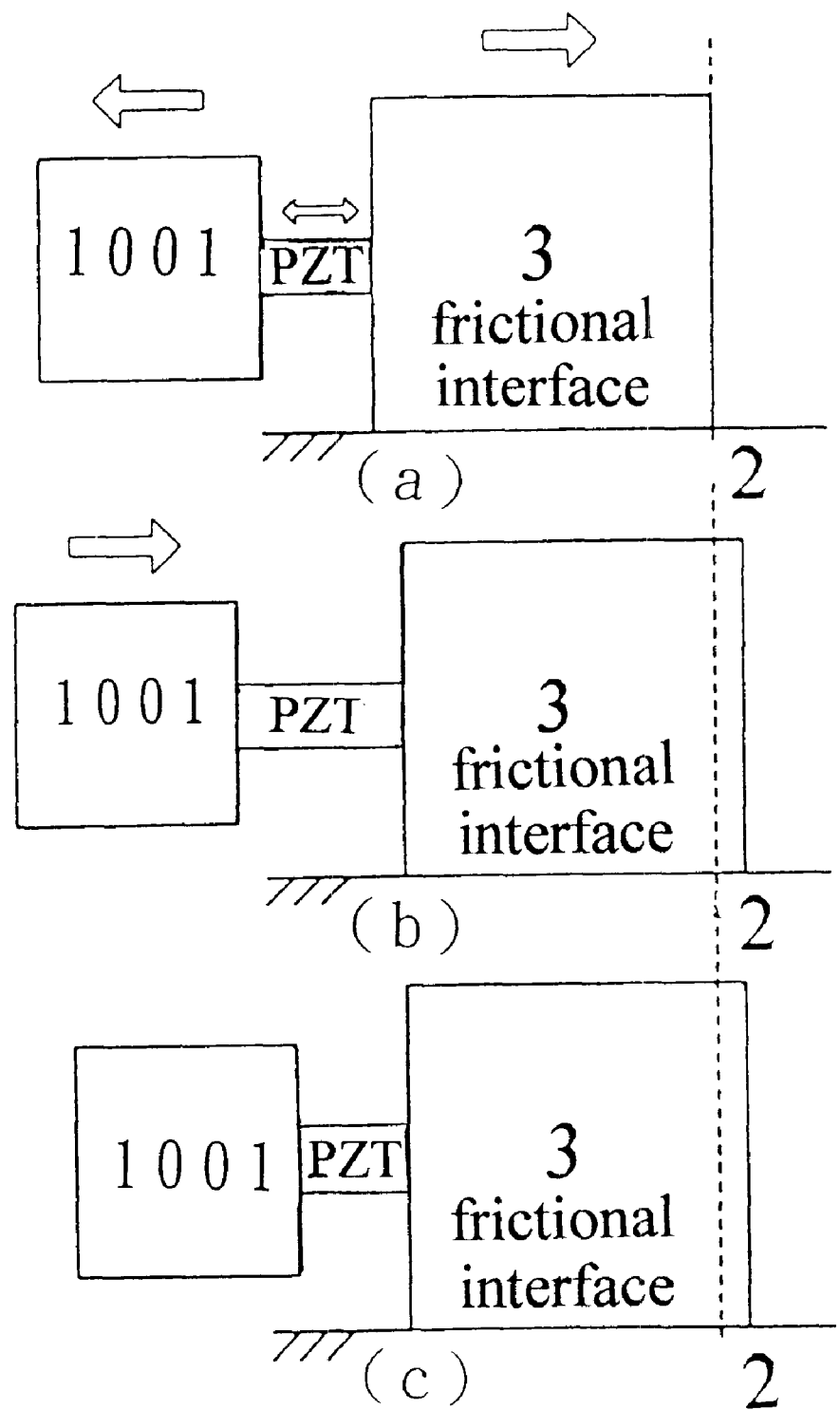
FIG. 4(*a*) illustrates a diagram of a reverse movement of the frictional-driven stage.

As to the X, Y axis frictional-driven stage (7, 8), the motion principle of the homoaxial only is shown in the diagram of the stepping motion. Please reference FIG. 4(*a*), wherein it will cooperate with various components of FIG. 1, such as the piezoelectric driver (1002) which connects with mass block (1001) and the translation stage (3). The translation stage will rest stationary on fixed base (2) by the contact-frictional force between the stainless steel plate (62) and fiber-optic sleeve of the glass fiber ferrule (64). If the voltage input to make the piezoelectric driver (1002) a fast motion, then mass block (1001) and translation stage (3) bear equal-inertia force. When this inertia force is bigger than maximum static frictional force between stainless steel plate (62) and fiber-optic sleeve of the glass fiber ferrula (64), translation stage (3) and the fixed base (2) have relative translation to take place, such as shown in FIG. 4(*b*). If the input voltage makes the piezoelectric driver (1002) travel to an original length slowly, the inertia force that translation stage (3) will bear does not exceed maximum static frictional force between stainless steel plate (62) and fiber-optic sleeve (64). Therefore, translation stage (3) can hold still on the fixed base (2), such as shown in FIG. 4(*c*). This translation procedure can achieve the single step translation of the XY axis frictional stage (7, 8), if this translation procedure will continuously progress, it can immediately attain the function of the continuous translation, then the stage that the frictional-driven principle is designed, is not limited to its travel range.

To explain the motion of X, Y axis frictional-driven stage (7, 8), the representative sawtooth waveform is used as the input voltage signal, see FIG. 5(*a*). When a tangent slope of an input waveform is bigger, just as the translation speed of the piezoelectric driver (1002) is quick, then the inertia force that translation stage (3) bear will be larger than the critical force of the frictional stick-slip effect. Because the inertia force with regard to the motion of the X, Y axis frictional-driven stage (7,8) has the crucial effect. If the frictional force between translation stage (3) and fixed base (2) can't oppose the inertia force coming from mass block (1001), the translation stage (3) will be in the sliding friction, and also generated by the translation of the single step.

When the tangent slope of the input waveform is smaller, then the translation speed of the piezoelectric driver (1002) is lower. The inertia force that mass block (1001) own is smaller than the critical force of the frictional stick-slip effect and for this reason translation stage (3) can hold still On the fixed base (2). It will complete a period of the stepping motion for this moment, if one continuously input a periodical voltage waveform, then it can achieve a continuous stepping motion. With regard to the input waveform, it also can use other driving voltage waveform to drive piezoelectric driver (1002) and translation performance of the stage will be the tremendous difference, such as Impulse Waveform, Transcendental Waveform or Cycloidal Waveform, etc. The operating method of the impulse waveform, such as shown in FIG. 5(*b*), can clearly discover that if there is a differential discontinuous point (singular point) in input waveform from this figure, and two lateral tangent slopes of this point have the tremendous difference, then the peak of the waveform is a primarily part of the driver's motion. When the input voltage pass by the peak of the driving waveform (such as impulse waveform), because, the momenta of mass block (1001) change too big, this translation stage (3) bear large inertia force, and the contact face between stainless steel plate (62) and fiber-optic sleeve (64) can't provide enough friction force to make translation stage (3) fixed. Each impulse waveform can achieve the stepping translation of the single step, if one continuously input impulse voltage waveform, then proceed with the continuous stepping motion to achieve the goal of long travel range position.

Synthesize the front description, the design of the X, Y axis frictional-driven stage (7, 8) can improve the defect, that is a travel range limitation of the precision positioning system for this time. It can provide the positioning system to achieve the long travel range and not affect completely the position resolution of the position system which is precise and long travel range. The driven mechanism (1) made primarily by a wire electro-discharge-machine is integral whole forming, and very simplificative, therefore it does not easily damage and service life lengthways, in spite of instrument applications of semiconductor, precision machinery, optical realm, surface microscopic engineering, or STM, SPM, AFM etc.

2. Z-axis Piezoelectric Stage

The composition construction of the Z-axis piezoelectric stage (9) such as shown in FIG. 1, includes the piezoelectric driver (91), flat-blade string (92), penetrable fillister (93), translation stage (94) and sample holder (95). Z-axis piezoelectric stage (9) compliant piezoelectric driver (91) used as driving apparatus, and apply the motion of deformation (material elastic deformation) of the flat-blade string to achieve the position object of high translation resolution. The Z-axis piezoelectric stage (9) has the electric capacity type translation sensor (96) inside it, and analog line controller to proceed to a feedback-loop position control. The sample holder (95) is used primarily for the clip to hold the sample to avoid the sample from shaking because of the stepping motion of the X, Y axis frictional stage (7, 8).

One end of the driver connects with the fixed base, the other end of the driver connects with translation stage (94). One end of flat-blade string (92) connects with fixed base, the other end of flat-blade string (92) connects with translation stage (94). There is a capacitive translation sensor in translation stage (94). When the driver is driven, it will provide the translation and action force to generate translation, through the guidance of the flat-blade string (92) that will generate the effect of the movement in the translation stage, to give rise to relative movement between the stage and fixed base. This relative motion is measured by a capacitive translation sensor to proceed. The closed-loop positioning control through the line analog controller.

The Z-axis piezoelectric stage (9) adopts the piezoelectric ceramic of the accumulating layer to be used as the driver. It has advantages such as compact in size, will respond quickly, the rise heat is minimum, and it will control easily. In addition with the axial-thrust bigger and translation resolution higher, and by the excellent and dynamic characteristics of piezoelectric driver, it can follow the periodic voltage signal to perform the dynamic microtranslation of the trace. It is suitable to be used as the driver of the Z-axis piezoelectric stage (9), though the piezoelectric driver (1002) is influenced itself by the effect of the hysteresis. It does not show completely the linear performance, and it usually can make the Z-axis piezoelectric driver (9) have very good precision through feedback control.

The driving mechanism of the Z-axis piezoelectric stage (9) is not a production method that will adopt traditional link mechanism, but will make use of the Wire Electro-Discharge-Machine to incise completely the driven mechanism of the stage, which is integral whole forming. The flat-blade string (92) fabricated by incision imitate the motion of the traditional link mechanism, to make the translation stage (94) have excellent performance on the microtranslation, because the deformation of the mechanism all take place in the place of the flat-blade string (92). Therefore, there is no gap, and there just the internal friction between molecule only. The loss of the energy is quite a little, and can attain alpine distinguishing resolution. The processing precision of Wire electro-discharge-machine can be 10 μm, for this reason linear motion of Z-axis piezoelectric stage (9) is without the traditional mechanism pack to give rise to the set of assembly error, and its straight line motion is very good.

3. Optical Autofocus System

Optical autofocus system of the wafer stepper includes:

A CD pick-up head;

A focus error signal processing circuit; and

An analog controller.

The CD pick-up head includes optical components, such as laser light source, microscope objective, polarizing beamsplitter, and prism. Making the Focus Error signal in the linear scope of S curve of the CD pick-up head used as the analog controller through the focus error signal processing circuit (84) to control the error signal of the loop permits control of the translation of the Z-axis microposition to maintain the CD pick-up head in the focusing scope. Its function is to make the Z-axis stage take the wafer to maintain the operating scope of optical focusing.

To observe the minuscule construction, it usually adopts the optical system to lend support to the observer, such as an ordinary microscope. The defect of the microscope is the high resolution which is more difficulty to achieve. Along with the development of the optoelectronic technique, one can make use of the optoelectronic sensor and electronic techniques to show at the TV screen the last image. The contrivance of the laser, make the surface engineering get further development. Optical autofocus servo system have higher resolution than a traditional microscope, therefore it will become the important tool for observing microstructures.

Compact disk is at fleetness revolution of disc. It makes use of the control of its servo system, to focus with one micron of precision on the spiral track, and it detects the received information by reflective light. The CD pick-up head on the CD machine will include optical components, such as, laser light source, microscope objective, polarizing beamsplitter, and a prism. This invention is based on a S curve constituted by Focus Error Signal of CD pick-up head (11), matching the straight line translation of the Z-axis piezoelectric stage (9), to be used as measurement for the perpendicular height of the surface of sample (10), and to proceed to the flat step-scan of the X, Y axis frictional-driven stage (7, 8) at the same time.

Figure 6:
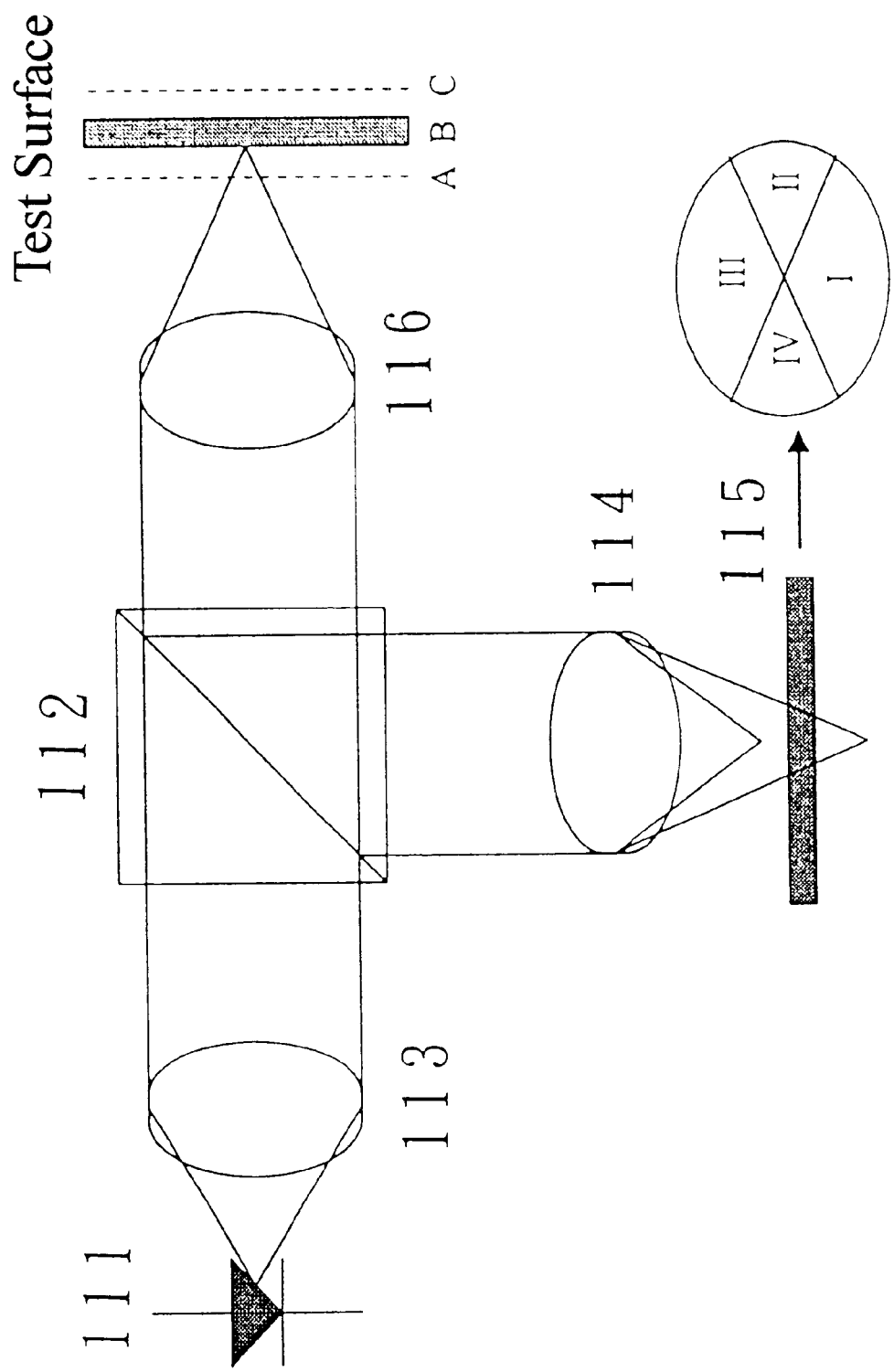
FIG. 6 illustrates a diagram of the optical autofocus system as set forth in the present invention.

CD pick-up head (11) is the most important division of the focusing servo system. It includes an optical component, microscope objective, the driver of the driving microscope objective, quad detector, because the different CD pick-up head (11) will use a different focus error principle, so the astigmatic focus error correcting system, which is applied in the market, is used as an example in this case. As shown in FIG. 6, the point source of light sent out by Laser Diode, will pass by disposal of the Collimating Lens and make the point source of light become the parallel light beam. It has been passed through prism and microscope objective to arrive at the disk or the reflection face of the sample. The reflective light beam is sent again through the microscope objective and prism to arrive at the Astigmatic Lens top, by the process of the astigmatic lens into the sensitive face of Quad Detector.

Astigmatic lens is one type of two focal plans of special lens. Its the most often seen as a geometric shape like a half cylindrical. Please refer to FIG. 7 for when apparent place of a sample is on the focal plan of the microscope objective. The reflective light through treatment of the astigmatic lens can become a circular light zone on the photo detector. If the surface of sample is situated on the nonfocal area microscope objective, by treatment of astigmatic lens, its shape of reflective light on the photo detector is elliptical.

Figure 7:
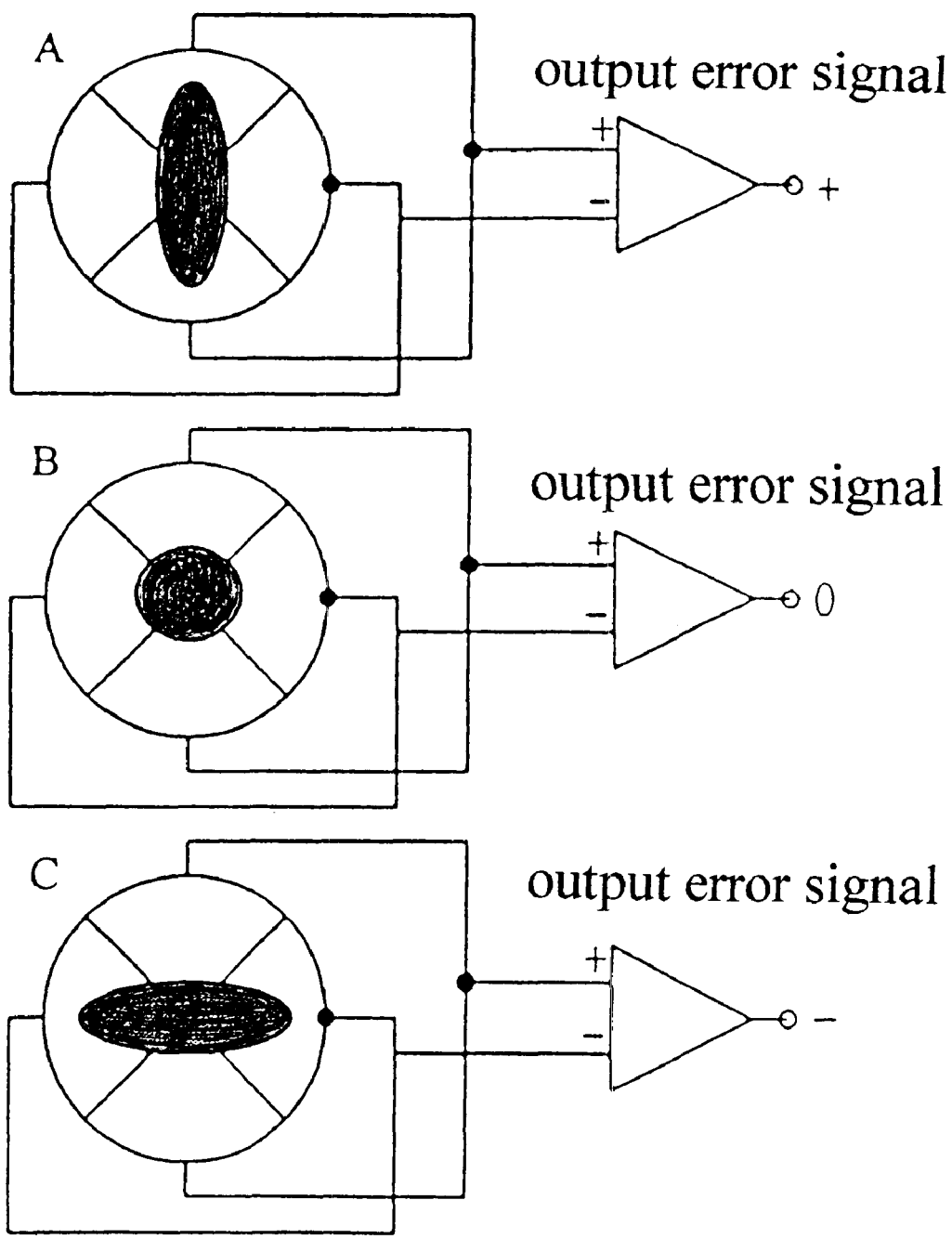
FIG. 7(*a*) (*b*) and (*c*) illustrates a process signal of a CD pick-up head.
Figure 8:
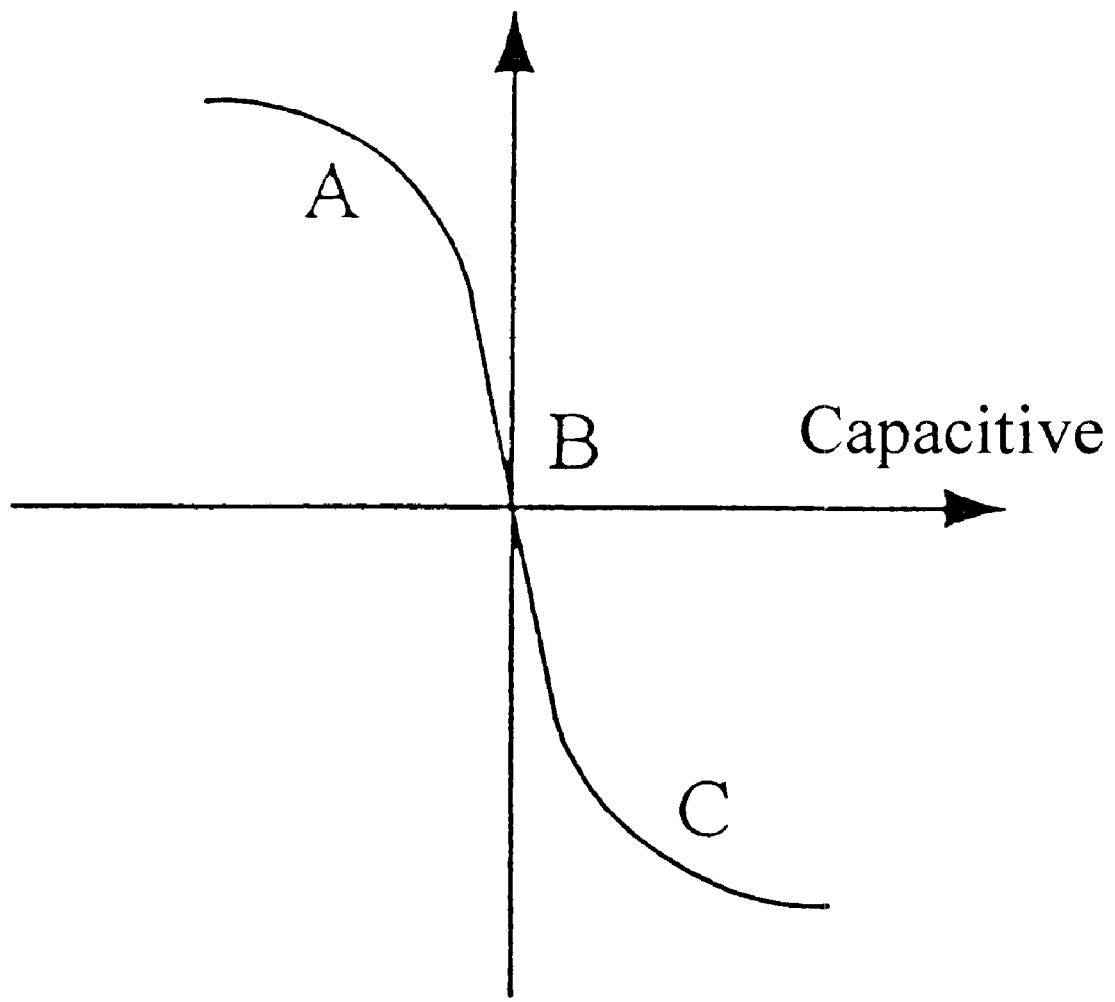
FIG. 8 illustrates a S-curve of focus error signal as generated in the present invention.

When the sample surface is placed on the nonfocal position of FIG. 6 (A), the reflective light treated with astigmatic lens will be a perpendicular-elliptical ring in photo detector, such as shown in FIG. 7. A signal of the photo detector treated by homemade focus error processing circuit (84) is a positive voltage output, as shown in the section of FIG. 8 "A". When a sample surface is placed on the focal position of FIG. 6 "B", reflective light in photo detector will become a circular ring, such as FIG. 7 "B". A signal of the photo detector treated by focus error processing circuit (84) is a zero voltage output, as shown in the section of FIG. 8 "B". When a sample surface is placed on the nonfocal position of FIG. 6 "B", the reflective light in the photo detector will become a horizontal-elliptical ring, such as shown in FIG. 7 "C" show. A signal of the photo detector treated by focus error processing circuit (84) is a negative voltage output, as shown in the section of FIG. 8 "C".

The curve shown in FIG. 8, is the most important S curve of the optical autofocus system, in this figure, each section or A, B and C are corresponding to three signal processing chart -A, B and C of FIG. 7. Linear region of focus error curve can be used as an application of translation measurement, and is an excellent measurement tool for dynamic, static characteristics. The linear region of the S curve is very good. It has good characteristics of a beautiful rectilinear, used in the middle region of servo-control (the range of the servo-control), which is roughly 10 $\mu$m. In regard to an ordinary CD pick-up head, the driver of its servo-control is the sound ring motor, and in order to move the position of microscope objective, it makes the laser always focusing on the surface of CD. But on the design of this invention, the method is to make microscope objective fixed, and match that with the Z axis piezoelectric stage (9) used as carrier of sample (10), moving the sample surface to the focal plan of microscope objective of the CD pick-up head to constitute a complete optical autofocus system. The translation of the sample (10) is retrieved with the capacitive translation sensor (96) of Z-axis piezoelectric stage (9).

Figure 9:
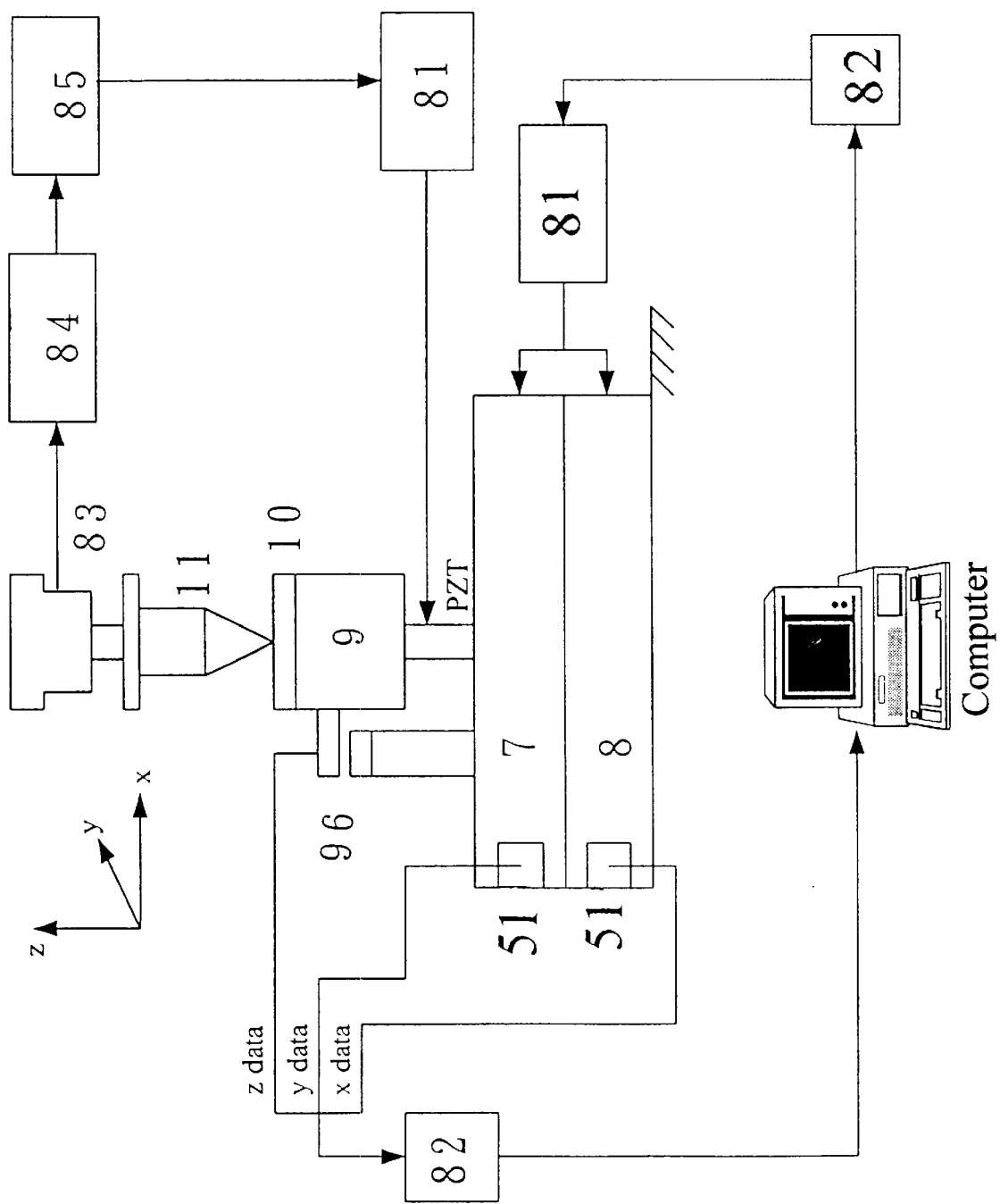
FIG. 9 illustrates an operating diagram of the wafer stepper as set forth in the present invention.

The wafer stepper designed includes a total of three subsystems, wherein each are X, Y axis frictional-driven stage (7, 8), Z-axis piezoelectric stage (9) and an optical autofocus system, three subsystems must be put together to develop the function of the wafer stepper. Integrate the structure such as shown in FIG. 9 which includes two closed-loop control systems, wherein one is a horizontal 2-D position control system in this figure, the other is a perpendicular optics autofocus position control system.

Perpendicular optics autofocusing position control system includes Z-axis piezoelectric stage (9), CD pick-up head (11), focus error signal processing circuit (84), differential controller (PID), or simulated differential controller (PDF) analog linear controller (85) and power amplifier (81) etc. Laser light of the CD pick-up head (11) project on the sample (10) surface, the returned reflective light is received by the photo detector of pick-up head, know the sample (10) surface if be placed in focus position, through signal treatment of focus error signal processing circuit (84). This signal is input into differential controller (PID) or simulated differential controller (PDF) analog linear control circuit, again through the engineering voltage of the power amplifier input into the piezoelectric driver (91), to make sample (10) surface always be placed, on the focal plan by the motion of the Z-axis piezoelectric stage (9), this then constitute a complete closed-loop control system.

The capacitive translation sensor (96) mounting in Z-axis piezoelectric stage (9) can measure the displacement of translation operate platen (94) when it is at focusing motion. This measurement value of displacement is an analog signal of voltage, and return to the personal computer by the digital mode through the conversion of the AD adapter, and this translation data is recorded.

The application of the wafer stepper of the DUV Lithography is fit to the alignment and multiple-repeat exposure of the Wafer and Mask, then it is used as the purpose of the Step- Repeat Projection, the Step- Scan Projection. The planar position ability of the XY axis frictional-driven stage (7,8) can used as the wafer stepper for good performance. Because the focus-operating range of Excimer laser is only about 1 $\mu$m on photoresist lamella of the wafer surface, the X, Y axis frictional-driven stage (7, 8) is at the translation of the long travel range. The incapability will guarantee translation of the wafer at the Z-direction which is smaller than 1 Am. For this reason, Z-axis piezoelectric stage (9) and CD pick-up head (11) composite optical autofocus system at the right moment will make the photoresist iamella of wafer surface position in the focus-operating range of the Excimer Laser long hours.

Experimental Results

Figure 10:
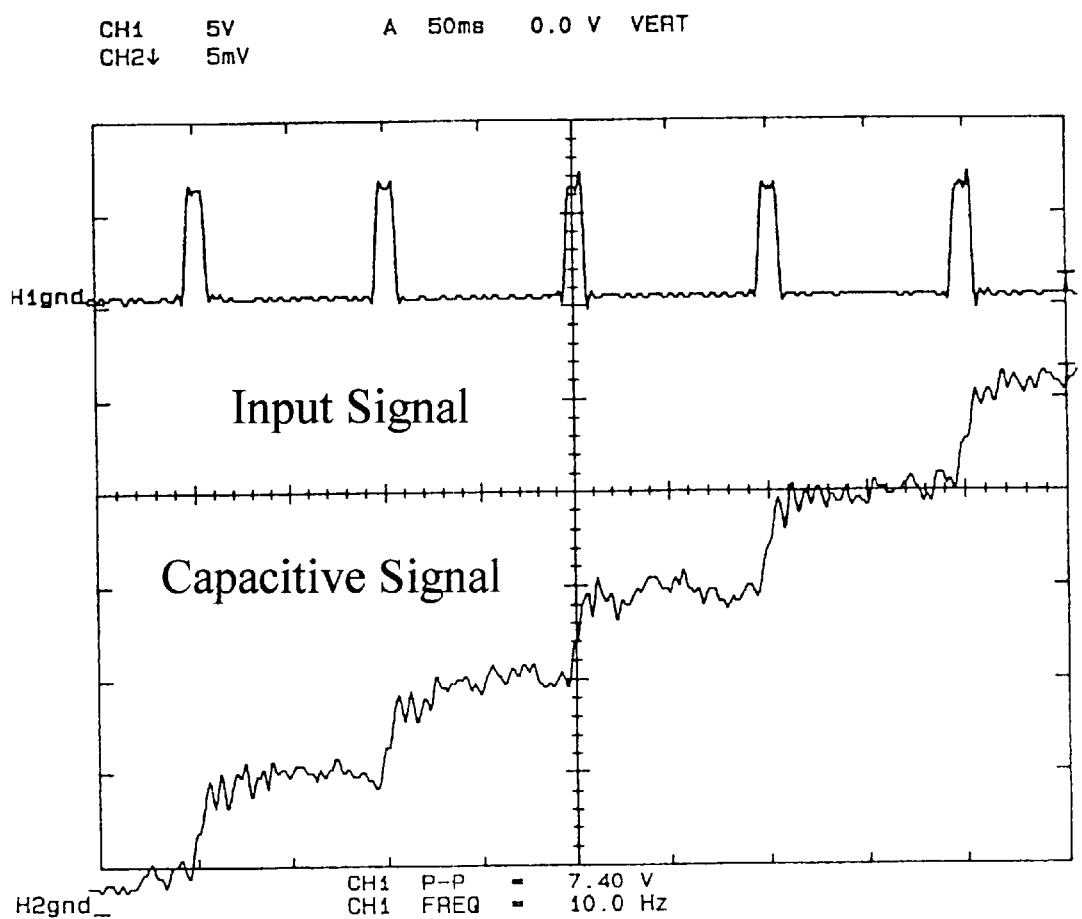
FIG. 10 illustrates the X-Y frictional-driven stage as an input of a pulse waveform.
Figure 11:
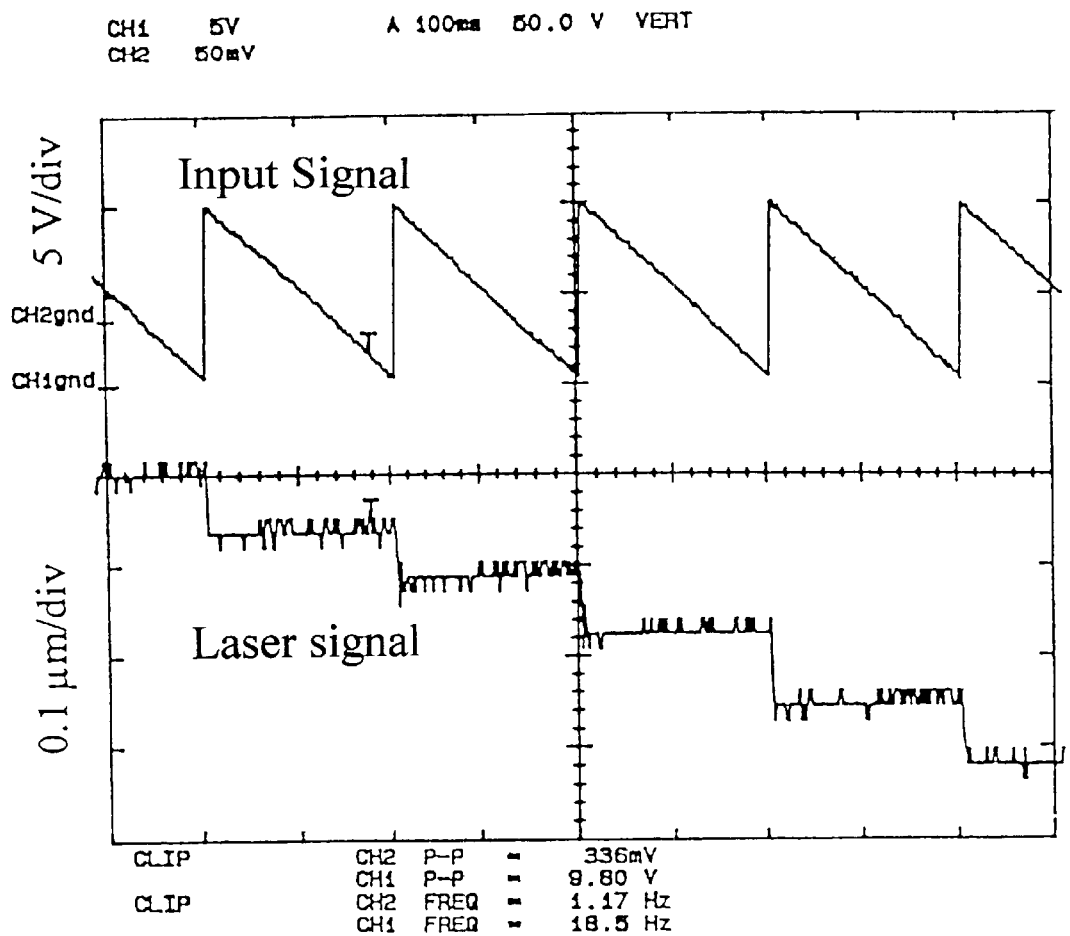
FIG. 11 illustrates the X-Y frictional-driven stage as an input of a saw-tooth waveform.

Malting use of the precision capacitive micrometer to be the measurement tool for stepping translation of the X, Y axis frictional-driven stage (7, 8), when input impulse waveform to the X, Y frictional-driven stage (7, 8), its translation reaction is shown in FIG. 10. The first half unit of the figure is an input of impulse voltage waveform, and the second half unit is for the stepping translation curve of the stage. The single step translation of the platen is 25 nm and its stepping translation is of equal consistence, then the repetition of each step progress of the stage is very high. The translation performance of the stage can be predicted and from the experiment result its highest translation resolution is 7.5 nm. If the input voltage signal of the X, Y axis frictional stage (7, 8) is a sawtooth waveform, and the translation curve of the stage is such as shown in FIG. 11. The first half unit of the figure is an input of sawtooth waveform voltage, the second half unit is a stepping translation curve of the stage, and the stepping translation of its single-step is 100 nm.

Figure 12:
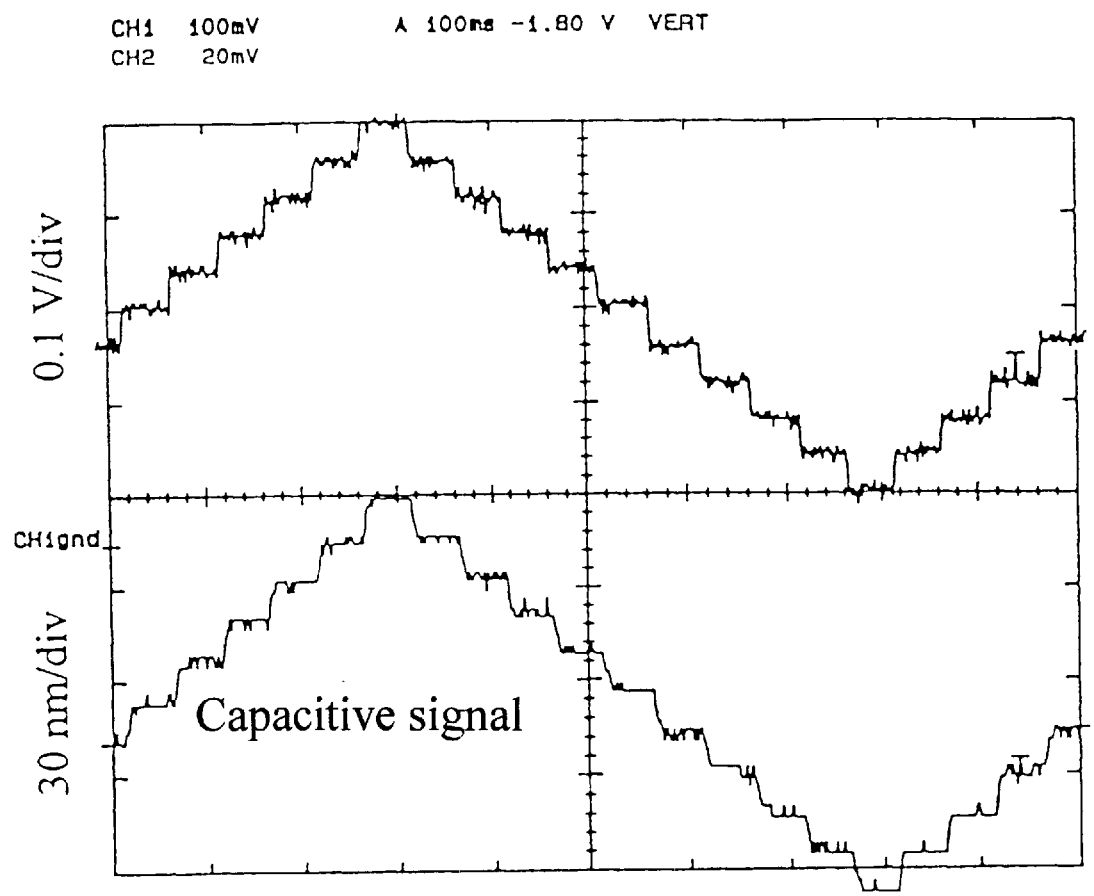
FIG. 12 illustrates the Z-axis piezoelectric stage as a input of a step waveform.

FIG. 12 displays an input of the Z-axis piezoelectric stage (9) with the step voltage waveform (first half unit of figure) to its translation reaction (second half unit of figure), making use of the capacitive translation sensor (96) to measure the translation of the translation workbench (94). Its translation curve is 12 nm/step. From the figure the translation curve of the translation workbench (94) almost has no gap for this reason, the stage at the position control of the open loop already has very good translation performance, and to attain higher translation resolution, then proceed with stricter control for the experimental environment and the interference of the electron signal. From the results of experiment measurement, the highest translation resolution of the Z-axis Piezoelectric stage is 3 nm/step.

Figure 13:
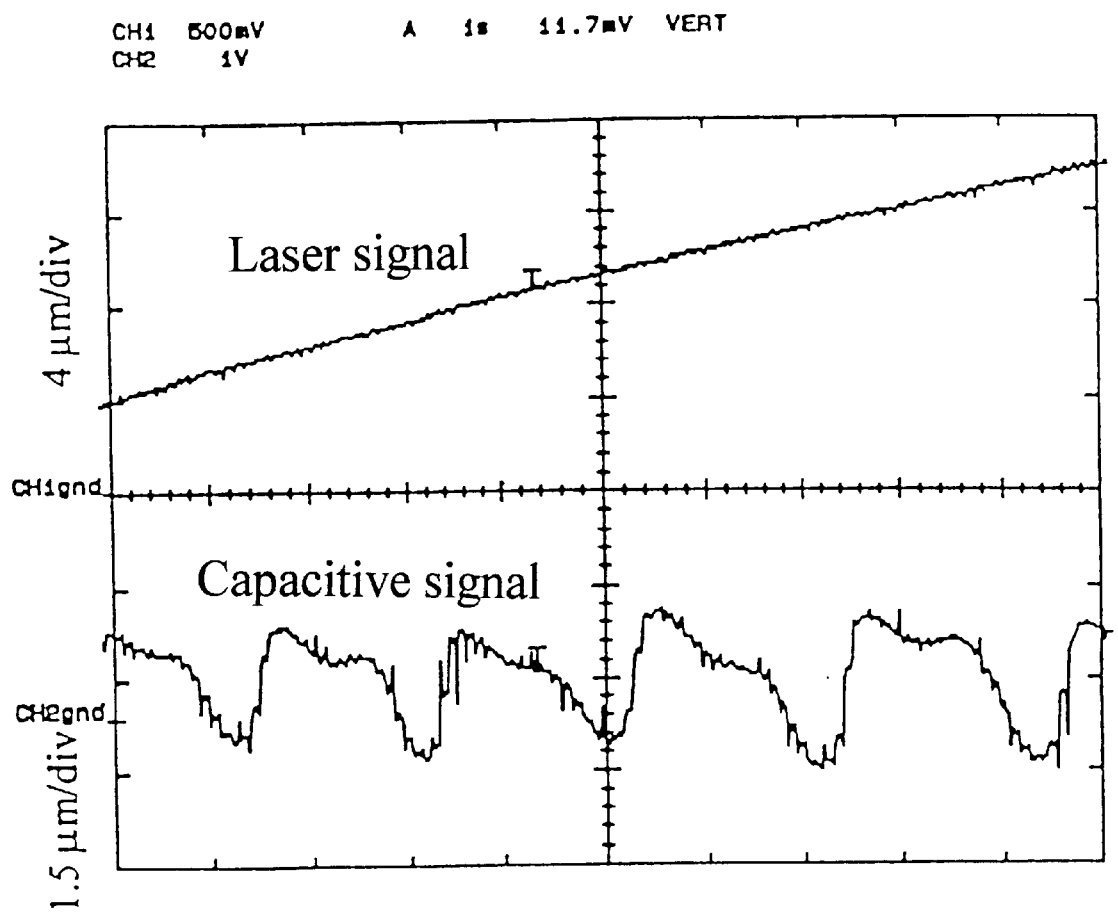
FIG. 13 illustrates the sample shape by the autofocus system as set forth in the present invention.

From the operating performance of the wafer stepper, grating samples whose period is 2 μm is adapted to test the performance of optical autofocus system and the X, Y axis frictional-driven stage (7, 8). FIG. 13 displays the translation situation of the Z-axis piezoelectric stage (9), as optical autofocus system operating, when X-axis frictional-driven stage (7) proceeds to stepping translation. The period of the horizontal translation curve is just 2 μm, and the change of the perpendicular height of the translation curve, and the depth of grating sample is alike, so the operating performance of the wafer stepper gets the identification.

This autofocus mechanism, adopting the single degree of freedom (Z-axis) high-translation resolution of piezoelectric stage, because the adoptive piezoelectric driver is a piezoelectric ceramic of accumulation layer type. It has advantages in many ways. It is compact size, will respond quick, heat rise is minimum and it is easily controlled. The piezoelectric element will sustain itself and the consequence of the hysteresis phenomenon. After feedback control, it can get very good improvement, detecting of autofocus and making use of CD pick-up head. The He—Ne laser projecting directly on the wafer will make the regulation of equidistant between the wafer and tight source, that is this mechanism is superior than the former on the performance. Gear mechanism of XY-axis for this case, b> the Stick- Slip Effect of the friction force, make a workbench to generate the continuous stepping translation, and in the stage ascend equip more ultra high resolution linear optical encoder used as translation sensor, make use of the program control method of the computer to proceed the feedback-position control of the XY-axis, the high-translation. resolution and long travel range position ability to keep both.

The foregoing is considered as illustrative only of the principles of the invention. Further, since numerous modifications and changes will readily occur to those skilled in the art, it is not desired to limit the invention to the exact construction and operation shown and described, and, accordingly, all suitable modifications and equivalents may be resorted to, falling within the scope of the invention.

What is claimed is:

1. A drive of a wafer stepper, comprising:
    X-Y axis frictional-driven stage being placed in a bottom of the wafer stepper, said X-Y axis frictional-driven stage having a X-Y driver and said X-Y driver being driven by a driving source of a voltage waveform for promoting said X-Y axis frictional-driven stage in independent movement along both the X and Y axis;
    Z-axis driven stage being fixed on top of the X-Y axis frictional-driven stage, said Z-axis driven stage having a Z-axis driver and said Z-axis driver being driven by a driving source of a voltage waveform for promoting said Z-axis driven stage to be engaged in independent movement along the Z axis, said Z axis being perpendicular to a plane in defining the X Y axis for permitting the wafer stepper to move in three dimensional along the X axis, Y axis and Z axis;
    a light source and photo-detector of an optical autofocus system placed above said Z-axis driven stage for projecting light on a wafer and for detecting reflective light on the wafer for use in beam focus signal processing, said photo-detector positioned inside said optical autofocus system;
    a focus error signal processing circuit and an analog linear controller for controlling signals with closed-feedback for adjusting movement in the Z-axis direction of said Z-axis driven stage for achieving optical beam focusing on the wafer; and
    said X-Y axis frictional-driven stage includes processing a differential discontinuous point in the input waveform supplied by the driving source, said discontinuous point causing two lateral tangent slopes with large differences, said X-Y axis frictional-driven stage taking the motion of the biggest translation in a peak of the waveform and inputting the driving waveform for achieving a continuous stepping motion, and selecting said input waveform from at least one of the following impulse waveform, transcendental waveform and cycloidal waveform.

2. The drive of the wafer stepper as recited in claim 1, wherein said X-Y axis frictional-driven stage includes a mass block, a driver having two ends, translation stage, flat blade string having two ends, fixed base, cross-roller bearing slide base, and linear optical encoder; and
    said one end of said driver connects with the translation stage, the other end of said driver connects said mass block, one end of said flat blade string connects with said mass block, said translation stage connects with said cross-roller bearing slide base, said linear optical encoder is positioned in the translation stage and the fixed base, said translation stage connects with a friction mechanism, and said friction mechanism connects with the fixed base;
    a differential discontinuous point in said driving source for quickly moving said driver, and said mass block and said translation stage bearing an equal inertia force;
    wherein when the inertia force is larger than a maximum static frictional force inside said friction mechanism, there occurs a sliding friction which forms between said translation stage and said fixed base, said cross-roller bearing slide being guided by said cross-roller bearing slide base and becomes a straight line displacement, and when the driving source makes said driver move to an original length, then the inertia force that said translation stage bear is below the maximum static frictional force of the frictional mechanism, said translation stage on a stationary base through the friction force and the frictional mechanism provide rest, and wherein the translation procedure achieves a single step translation of the stage, and the translation procedure continuously progresses, when the function of continuous translation occurs.

3. The drive of said wafer stepper according to claim 1, wherein said driver of said X-Y axis frictional-driven stage includes at least one of the following piezoelectric material, magnetizing-flexible material, electromagnetic motor, memorizing-shape alloy and other drivers driven by optical, electric, heat and magnetic energy.

4. The drive of said wave stepper according to claim 1, wherein said driver of said Z axis frictional-driven stage includes at least one of the following piezoelectric material, magnetizing-flexible material, electromagnetic motor, memorizing-shape alloy and other drivers driven by optical, electric, heat and magnetic energy for achieving high precision.

5. A drive of a wafer stepper, comprising:
    X-Y axis frictional-driven stage being placed in a bottom of the wafer stepper, said X-Y axis frictional-driven stage having a X-Y driver and said X-Y driver being driven by a driving source of a voltage waveform for promoting said X-Y axis frictional-driven stage in independent movement along both the X and Y axis;

Z-axis driven stage being fixed on top of the X-Y axis frictional-driven stage, said Z-axis driven stage having a Z-axis driver and said Z-axis driver being driven by a driving source of a voltage waveform for promoting said Z-axis driven stage to be engaged in independent movement along the Z axis, said Z axis being perpendicular to a plane in defining the X Y axis for permitting the wafer stepper to move in three dimensional along the X axis, Y axis and Z axis;

a light source and photo-detector of an optical autofocus system placed above said Z-axis driven stage for projecting light on a wafer and for detecting reflective light on the wafer for use in beam focus signal processing, said photo-detector positioned inside said optical autofocus system;

a focus error signal processing circuit and an analog linear controller for controlling signals with closed-feedback for adjusting movement in the Z-axis direction of said Z-axis driven stage for achieving optical beam focusing on the wafer; and the Z-axis driving stage includes:
driver having two ends,
flat blade string having two ends,
translation,
fixed base,
capacitive translation sensor, and
said one end of said driver connects to said fixed base, the other end of said driver, connects with translation stage, said one end of said flat blade string connects with said fixed base; and
a translation workbench inner having a capacitive translation sensor, and after said driver receiving the drive source, providing the translation and action force for generating translation through a guidance of said flat blade string, wherein the generating effects movement in the translation workbench to give rise to relative movement between the workbench and fixed base, said relative movement being measured by said capacitive translation sensor for proceeding to a closed-loop positioning control through a line analog controller.

6. The drive of the wafer stepper as recited in claim 5, wherein said X-Y axis frictional-driven stage includes a mass block, driver having two ends, translation stage, flat blade string having two ends, fixed base, cross-roller bearing slide base, and linear optical encoder;
said one end of said driver connects with the translation stage, the other end of said driver connects said mass block, one end of said flat blade string connects with said mass block, said translation stage connects with said cross-roller bearing slide base, said linear optical encoder is positioned in the translation stage and the fixed base, said translation stage connects with a friction mechanism, and said friction mechanism connects with the fixed base;
a differential discontinuous point in said driving source for quickly moving said driver, and said mass block and said translation stage bearing an equal inertia force; and
wherein when the inertia force is larger than a maximum static frictional force inside said friction mechanism, there occurs a sliding friction which forms between said translation stage and said fixed base, said cross-roller bearing slide being guided by said cross-roller bearing slide base and becomes a straight line displacement, and when the driving source makes said driver move to an original length, then the inertia force that said translation stage bear is below the maximum static frictional force of the frictional mechanism, said translation stage on a stationary base through the friction force and the frictional mechanism provide rest, and wherein the translation procedure achieves a single step translation of the stage, and the translation procedure continuously progresses, when the function of continuous translation occurs.

7. The drive of said wafer stepper according to claim 5, wherein said driver of said X-Y axis frictional-driven stage includes at least one of the following piezoelectric material, magnetizing-flexible material, electromagnetic motor, memorizing-shape alloy and other drivers driven by optical, electric, heat and magnetic energy.

8. The drive of said wave stepper according to claim 5, wherein said driver of said Z axis frictional-driven stage includes at least one of the following piezoelectric material, magnetizing-flexible material, electromagnetic motor, memorizing-shape alloy and other drivers driven by optical, electric, heat and magnetic energy for achieving high precision.

9. A drive of a wafer stepper, comprising:
X-Y axis frictional-driven stage being placed in a bottom of the wafer stepper, said X-Y axis frictional-driven stage having a X-Y driver and said X-Y driver being driven by a driving source of a voltage waveform for promoting said X-Y axis frictional-driven stage in independent movement along both the X and Y axis;
Z-axis driven stage being fixed on top of the X-Y axis frictional-driven stage, said Z-axis driven stage having a Z-axis driver and said Z-axis driver being driven by a driving source of a voltage waveform for promoting said Z-axis driven stage to be engaged in independent movement along the Z axis, said Z axis being perpendicular to a plane in defining the X Y axis for permitting the wafer stepper to move in three dimensional along the X axis, Y axis and Z axis;
a light source and photo-detector of an optical autofocus system placed above said Z-axis driven stage for projecting light on a wafer and for detecting reflective light on the wafer for use in beam focus signal processing, said photo-detector positioned inside said optical autofocus system;
a focus error signal processing circuit and an analog linear controller for controlling signals with closed-feedback for adjusting movement in the Z-axis direction of said Z-axis driven stage for achieving optical beam focusing on the wafer; and
the optical autofocus system includes
CD pick-up head;
focus error signal processing circuit; and an
analog controller,
said CD pick-up head includes optical components, including at least one of the following laser light source, microscope objective, polarizing beamsplitter, and prism;
said focus error signal processing circuit producing a focus error signal in a linear scope of an S curve on the CD pick-up head for use in said analog controller, the focus error signal processing circuit controlling the error signal of a closed-loop, and controlling the translation of the Z-axis microposition to focus a scope inside in the CD pick-up head; and wherein during the Z-axis stage moves the wafer to maintain the optical autofocus system inside.

10. The drive of the wafer stepper as recited in claim 9, wherein said X-Y axis frictional-driven stage includes a mass block, driver having two ends, translation stage, flat blade string having two ends, fixed base, cross-roller bearing slide base, and linear optical encoder;

said one end of said driver connects with the translation stage, the other end of said driver connects said mass block, one end of said flat blade string connects with said mass block, said translation stage connects with said cross-roller bearing slide base, said linear optical encoder is positioned in the translation stage and the fixed base, said translation stage connects with a friction mechanism, and said friction mechanism connects with the fixed base;

a differential discontinuous point in said driving source for quickly moving said driver, and said mass block and said translation stage bearing an equal inertia force; and wherein when the inertia force is larger than a maximum static frictional force inside said friction mechanism, there occurs a sliding friction which forms between said translation stage and said fixed base, said cross-roller bearing slide being guided by said cross-roller bearing slide base and becomes a straight line displacement, and when the driving source makes said driver move to an original length, then the inertia force that said translation stage bear is below the maximum static frictional force of the frictional mechanism, said translation stage on a stationary base through the friction force and the frictional mechanism provide rest, and wherein the translation procedure achieves a single step translation of the stage, and the translation procedure continuously progresses, when the function of continuous translation occurs.

11. The drive of said wafer stepper according to claim 9, wherein said driver of said X-Y axis frictional-driven stage includes at least one of the following piezoelectric material, magnetizing-flexible material, electromagnetic motor, memorizing-shape alloy and other drivers driven by optical, electric, heat and magnetic energy.

12. The drive of said wave stepper according to claim 9, wherein said driver of said Z axis frictional-driven stage includes at least one of the following piezoelectric material, magnetizing-flexible material, electromagnetic motor, memorizing-shape alloy and other drivers driven by optical, electric, heat and magnetic energy for achieving high precision.

* * * * *